(12) United States Patent
Hosotani (10) Patent No.: US 10,893,635 B2
(45) Date of Patent: Jan. 12, 2021

(54) HIGH FREQUENCY POWER CIRCUIT MODULE

(71) Applicant: Murata Manufacturing Co., Ltd., Kyoto-fu (JP)

(72) Inventor: Tatsuya Hosotani, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/717,617

(22) Filed: Dec. 17, 2019

(65) Prior Publication Data

US 2020/0128689 A1 Apr. 23, 2020

Related U.S. Application Data

(63) Continuation of application No. PCT/JP2018/023277, filed on Jun. 19, 2018.

(30) Foreign Application Priority Data

Jul. 7, 2017 (JP) ................. 2017-133392

(51) Int. Cl.
*H05K 1/02* (2006.01)
*H05K 7/20* (2006.01)
(Continued)

(52) U.S. Cl.
CPC ............ *H05K 7/209* (2013.01); *H05K 1/028* (2013.01); *H05K 1/165* (2013.01); *H05K 1/189* (2013.01);
(Continued)

(58) Field of Classification Search
CPC .............. H05K 1/028; H05K 1/189; H05K 2201/10037; H05K 1/165; H05K 7/209;
(Continued)

(56) References Cited

U.S. PATENT DOCUMENTS

2010/0257725 A1* 10/2010 Akiho ................ C01G 49/0018
29/600
2015/0288054 A1* 10/2015 Orihara .................... H01Q 1/52
343/702

(Continued)

FOREIGN PATENT DOCUMENTS

| JP | 2016-039337 A | 3/2016 |
| WO | 2010/131524 A1 | 11/2010 |
| WO | 2012/036139 A1 | 3/2012 |

OTHER PUBLICATIONS

International Search Report issued in PCT/JP2018/023277; dated Sep. 11, 2018.

(Continued)

*Primary Examiner* — Sherman Ng
(74) *Attorney, Agent, or Firm* — Studebaker & Brackett PC (57) ABSTRACT

A high frequency power circuit module includes an electronic circuit substrate having a bending section, a high frequency power circuit formed on the electronic circuit substrate, a battery connected to the high frequency power circuit, and a magnetic material sheet having an area larger than that of the battery. The battery is covered with the magnetic material sheet in a state in which the electronic circuit substrate is bent at a bending section. The high frequency power circuit, the battery, and the magnetic material sheet are thermally coupled to each other by a resin sealing member, which is a material having a smaller thermal resistance than that of air.

20 Claims, 9 Drawing Sheets

(51) Int. Cl.
   *H05K 1/16*   (2006.01)
   *H05K 1/18*   (2006.01)
   *G06K 17/00*  (2006.01)

(52) U.S. Cl.
   CPC ............... *G06K 17/0003* (2013.01); *H05K 2201/10037* (2013.01)

(58) Field of Classification Search
   CPC .......... H05K 2203/1327; H05K 3/284; H05K 2201/056
   USPC ........................................................ 361/720
   See application file for complete search history.

(56) References Cited

U.S. PATENT DOCUMENTS

| | | | | |
|---|---|---|---|---|
| 2015/0326056 | A1* | 11/2015 | Koyanagi | H02J 50/90 320/108 |
| 2016/0276749 | A1* | 9/2016 | Komachi | H01Q 1/38 |
| 2017/0139442 | A1* | 5/2017 | Yoshizumi | G06F 1/1641 |

OTHER PUBLICATIONS

International Preliminary Report on Patentability and Written Opinion issued in PCT/JP2018/023277; dated Jan. 7, 2020.

\* cited by examiner

HIGH FREQUENCY POWER CIRCUIT MODULE

CROSS-REFERENCE TO RELATED APPLICATIONS

This application claims benefit of priority to International Patent Application No. PCT/JP2018/023277, filed Jun. 19, 2018, and to Japanese Patent Application No. 2017-133392, filed Jul. 7, 2017, the entire contents of each are incorporated herein by reference.

BACKGROUND

Technical Field

The present disclosure relates to a module including a high frequency power circuit, and more particularly to a high frequency power circuit module incorporating therein a component that generates heat during the operation.

Background Art

A reader/writer antenna module used for short range communication with an RFID tag is disclosed in International Publication No. WO 2012/036139. The stated reader/writer antenna module is provided with a flexible substrate including a first base section, a second base section, and a bending section connecting the first base section and the second base section. The flexible substrate has a structure in which the flexible substrate is bent at the bending section in such a manner that a first main surface of the first base section and a first main surface of the second base section face each other. Further, a magnetic material layer is disposed between an antenna conductor and a chip-type component.

SUMMARY

Since the reader/writer antenna module disclosed in International Publication No. WO 2012/036139 includes the magnetic material layer between the antenna conductor and the chip component, such effects are exhibited that isolation can be secured between the antenna conductor and the chip component, and the chip component is protected from external noise, external stress, and the like.

However, in the module configured such that a plurality of base sections is bent at the bending section to overlap each other as discussed above, a heat dissipation effect of a circuit element provided in the base section is small due to the structure of the module. For this reason, for example, when a component that generates heat during the operation is incorporated in a module such as the module configured to handle high frequency power, overheating of the component that generates heat or overheating of components and members near the component that generates heat may cause a problem to occur. Further, when a module incorporates a battery therein, in a case where such magnetic flux is generated to pass through the battery, an eddy current causing power loss flows in electrodes of the battery or the like, and the battery generates heat due to power loss, thereby raising a problem that the life of the battery is remarkably shortened.

Accordingly, the present disclosure provides a high frequency power circuit module excellent in heat dissipation, and a high frequency power circuit module in which the problem of heat generation of the battery is solved.

(1) A high frequency power circuit module according to the present disclosure includes an electronic circuit substrate having a bending section; a high frequency power circuit formed on the electronic circuit substrate; a battery electrically connected to the high frequency power circuit; and a magnetic material layer having a projected area larger than that of the battery. The battery is covered with the magnetic material layer in a state in which the electronic circuit substrate is bent at the bending section. The high frequency power circuit module further includes a material to fill a space between the high frequency power circuit and at least one of the battery and the magnetic material layer. Also, the material has a thermal resistance lower than a thermal resistance of air, and thermally couples the high frequency power circuit and at least one of the battery and the magnetic material layer.

According to the above configuration, since the high frequency power circuit, the battery, and the magnetic material layer are thermally coupled to each other with the material having a low thermal resistance, thermal capacity of the module is increased, so that a heat dissipation effect against Joule heat which is generated due to the power loss is enhanced. Therefore, overheating of heat generating portions is prevented. The magnetic material layer prevents magnetic flux coming from the outside or magnetic flux generated by a coil provided within the module from linking with electrodes of the battery, whereby the heat generation of the battery is also suppressed.

(2) It is preferable that the high frequency power circuit include a display electronic component mounted on the electronic circuit substrate, the above-mentioned material be made of a light-transmitting resin, and display of the display electronic component be visible through the material. With this, the display content of the display element may be visually recognized from the outside even if the entire module is covered with the light-transmitting resin.

(3) The above-mentioned material is, for example, a cold-processing resin. With this, an electronic component or the like which is vulnerable to heat and pressure can be easily embedded in the resin. Further, the resin can also enter into the interior of a porous material.

(4) The material is, for example, a light-transmitting hot embedding resin using an acrylic resin powder. This makes it possible to visually recognize the display of the display electronic component with ease. Further, resin sagging of the edge portion can be reduced, and the curing time can be shortened.

(5) It is preferable that the electronic circuit substrate have a projecting section connected thereto via the bending section, and that an electrode to which the battery is connected be formed on the projecting section. This structure facilitates electrical and mechanical connections to the electrode of the battery.

(6) It is preferable that a heat conductive sheet be disposed between the battery and the magnetic material layer. With this structure, the heat dissipation effect of the battery through the heat conductive sheet is enhanced.

(7) When a heat generating element, which is a semiconductor electronic component, is mounted on the electronic circuit substrate, it is preferable that a heat conductive sheet be disposed between the heat generating element and the magnetic material layer. As a result, heat dissipation of the heat generating element is enhanced.

(8) A lamination structure including a forming section of the high frequency power circuit of the electronic circuit substrate, the battery, and the magnetic material layer may be constituted in a state in which the electronic circuit substrate is bent at the bending section; further, a housing made of an insulating body that is configured to accommodate the lamination structure may be provided. This structure enhances structural robustness.

(9) For example, the battery may be a secondary battery, and the high frequency power circuit may be a circuit including a power receiving coil and configured to charge the secondary battery with the power received by the power receiving coil. With this configuration, the high frequency power is received wirelessly to charge the secondary battery, so that the high frequency power circuit module may be used as a module that can be charged and discharged.

(10) For example, an internal connection electrode to be electrically connected to the battery may be formed on the electronic circuit substrate. With this configuration, the high frequency power circuit module may be used as a battery that can be wirelessly charged.

(11) It is preferable that the battery be connected to the internal connection electrode with a conductive adhesive. This makes it possible to electrically connect the battery without the battery being heated to a high temperature.

(12) It is preferable for the conductive adhesive to be a modified silicone-based elastic adhesive of polymer base into which silver is blended. As a result, a sufficiently low resistivity can be effectively utilized, thereby making it possible to reduce the loss.

(13) It is preferable that an external connection electrode to be electrically connected to the battery be formed on the electronic circuit substrate. This makes it possible to utilize the external connection electrode as a substantial electrode of the battery.

(14) The electronic circuit substrate is a flexible resin multilayer substrate formed by a batch lamination heating press of a plurality of resin base materials including a resin base material on which a copper foil pattern is formed, and it is preferable that each of a relative dielectric constant, a dielectric loss tangent, and a coefficient of water absorption of the resin base material be small in comparison with a glass epoxy-based substrate resin material.

With the above configuration, the electronic circuit substrate is formed to be thin and flexible in comparison with a multilayer substrate having a structure in which base materials are bonded to each other with an adhesive layer interposed therebetween, and can be disposed in a limited predetermined three-dimensional space. Further, it is possible to make the electronic circuit substrate excellent in high frequency characteristics.

According to the present disclosure, it is possible to achieve a high frequency power circuit module excellent in heat dissipation, and a high frequency power circuit module in which the problem of heat generation of the battery is solved.

DETAILED DESCRIPTION

Hereinafter, a plurality of embodiments for carrying out the present disclosure will be described while citing several specific examples with reference to the drawings. In the drawings, the same reference signs are given to the same constituent elements. Although the embodiments will be described one by one for convenience in view of the ease of explaining the points or the ease of understanding the contents, partial substitutions or combinations of the configurations in different embodiments are possible to be made. In and after a second embodiment, description of the same things as those in a first embodiment will be omitted, and only different points will be described. In particular, the same effects achieved by the same configurations will not be described one by one in each embodiment.

First Embodiment

Figure 1:
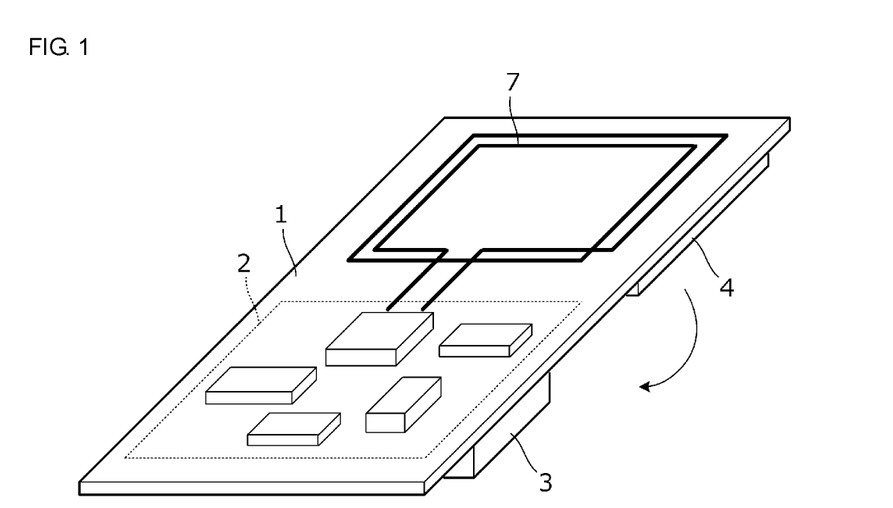
FIG. 1 is a perspective view of an electronic circuit substrate included in a high frequency power circuit module according to a first embodiment, in which the electronic circuit substrate is in an unfolded state.
Figure 2:
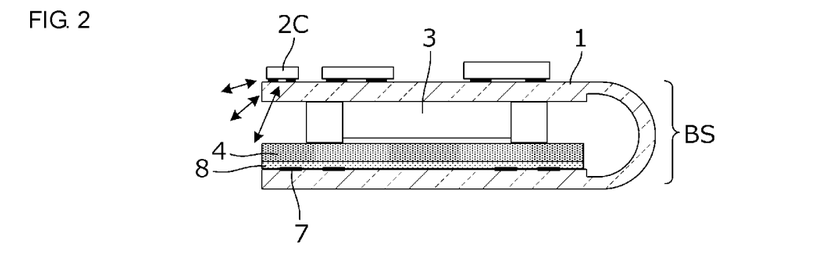
FIG. 2 is a cross-sectional view of a lamination structure of a high frequency power circuit module.
Figure 3A:
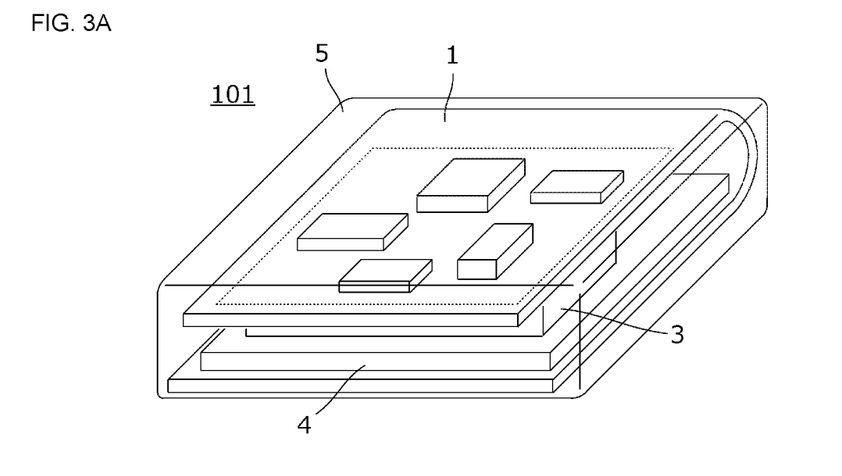
FIG. 3A is a perspective view of a high frequency power circuit module.
Figure 3B:
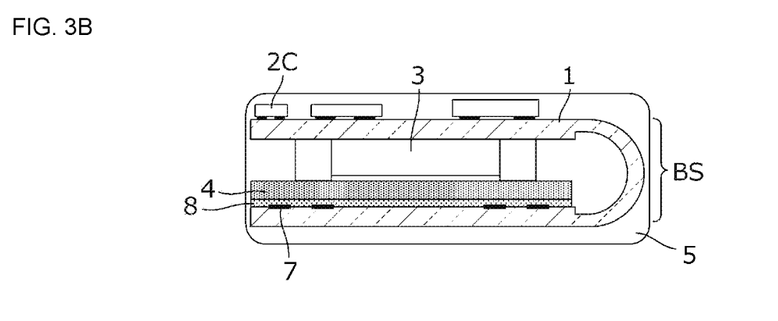
FIG. 3B is a cross-sectional view of the high frequency power circuit module.

FIG. 1 is a perspective view of an electronic circuit substrate included in a high frequency power circuit module according to the first embodiment, in which the electronic circuit substrate is in an unfolded state. FIG. 2 is a cross-sectional view of a lamination structure of the high frequency power circuit module. FIG. 3A is a perspective view of a high frequency power circuit module 101, and FIG. 3B is a cross-sectional view of the high frequency power circuit module 101.

The high frequency power circuit module 101 includes an electronic circuit substrate 1 having a bending section, a high frequency power circuit 2 formed on the electronic circuit substrate 1, a battery 3 connected to the high frequency power circuit 2, and a magnetic material sheet 4 having an area larger than that of the battery 3. Specifically, the projected area of the magnetic material sheet 4 is larger than that of the battery 3. The magnetic material sheet 4 is an example of a "magnetic material layer" according to the present disclosure. The magnetic material sheet 4 is a composite sheet of a resin and a magnetic ferrite plate or magnetic ferrite powder. In cross-sectional views illustrated in FIG. 2 and subsequent figures, the battery 3 and chip components are not hatched.

It is preferable that the electronic circuit substrate 1 be a flexible resin multilayer substrate formed by a batch lamination heating press of a plurality of resin base materials including a resin base material, such as a liquid crystal polymer (LCP), on which a copper foil pattern is formed. In particular, it is preferable that each of a relative dielectric constant, a dielectric loss tangent, and a coefficient of water absorption of the resin base material be small in comparison with a glass epoxy-based substrate resin material. By using the above-discussed electronic circuit substrate 1, the electronic circuit substrate is formed to be thin and flexible in comparison with a multilayer substrate, such as a glass epoxy-based substrate, having a structure in which base materials are bonded to each other with an adhesive layer interposed therebetween, and can be disposed in a limited predetermined three-dimensional space. Further, it is possible to make the electronic circuit substrate excellent in high frequency characteristics.

When the electronic circuit substrate 1 is bent, from the state illustrated in FIG. 1, at a bending section BS, a lamination structure is constituted in which a forming section of the high frequency power circuit 2 on the electronic circuit substrate 1, the battery 3, and the magnetic material sheet 4 are included, as illustrated in FIG. 2. In the lamination structure, the battery 3 is covered with the magnetic material sheet 4 in a state in which the electronic circuit substrate 1 is bent at the bending section BS.

The magnetic material sheet 4 has a size larger than the outer shape of a coil 7. Due to this, the magnetic flux linking with the coil 7 is not confined in the magnetic material sheet 4, and the magnetic material sheet 4 serves as a magnetic path for the magnetic flux linking with the coil 7.

As illustrated in FIG. 3A and FIG. 3B, the high frequency power circuit 2, the battery 3, and the magnetic material sheet 4 are sealed by a resin sealing member 5. In other words, a space among the high frequency power circuit 2, the battery 3, and the magnetic material sheet 4 is filled with the resin sealing member 5. With this structure, the high frequency power circuit 2, the battery 3, and the magnetic material sheet 4 are thermally coupled to each other. The resin sealing member 5 is, for example, a transparent epoxy resin, which is a material having a smaller thermal resistance than that of air. This transparent epoxy resin is an example of a "light-transmitting resin" according to the present disclosure.

Figure 4A:
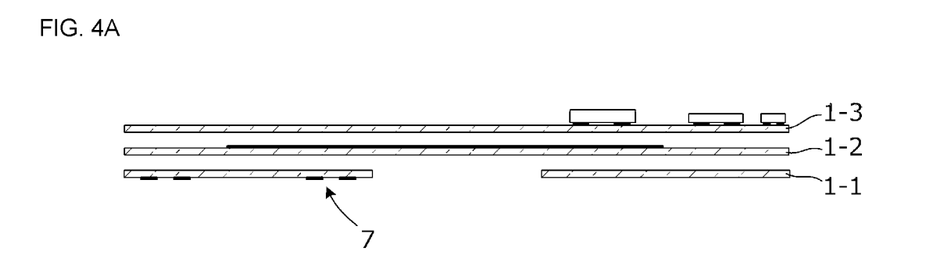
FIG. 4A, FIG. 4B, and FIG. 4C are cross-sectional views illustrating configurations of an electronic circuit substrate and components mounted on the electronic circuit substrate included in the high frequency power circuit module according to the first embodiment.
Figure 4B:
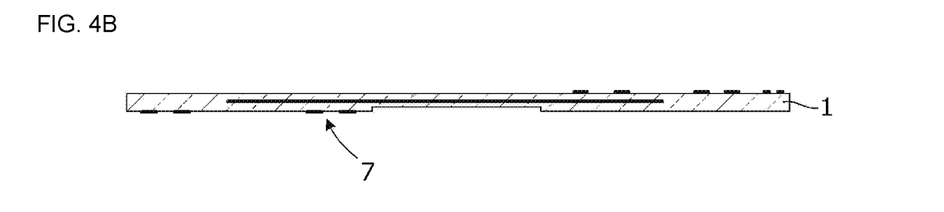
Figure 4C:
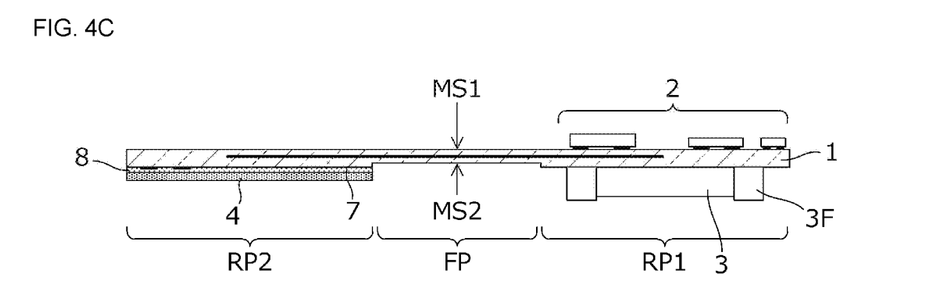

FIG. 4A, FIG. 4B, and FIG. 4C are cross-sectional views illustrating configurations of the electronic circuit substrate and the components mounted on the electric circuit substrate included in the high frequency power circuit module according to the present embodiment. As illustrated in FIG. 4A, the electronic circuit substrate 1 is constituted of a plurality of base materials 1-1, 1-2, and 1-3 each having a predetermined conductor pattern formed thereon. In this example, a conductor pattern prepared by the patterning of a copper foil is formed on each of the base materials 1-1, 1-2, and 1-3. The base materials 1-1, 1-2, and 1-3 are each made of a thermoplastic resin such as a liquid crystal polymer (LCP), and are integrated by a heating press.

The electronic circuit substrate 1 includes a flexible portion FP where the number of laminated layers of base materials is small, and a first rigid portion RP1 and a second rigid portion RP2 where the number of laminated layers of base materials is large. A first main surface MS1 of the electronic circuit substrate 1 is an outer surface after the lamination structure is constituted, and a second main surface MS2 thereof is an inner surface after the lamination structure is constituted.

A battery folder 3F is provided on the second main surface MS2 side of the first rigid portion RP1, and the battery 3 is attached to the battery folder 3F. The battery 3 is, for example, a secondary battery, and the amount of heat generation at the charge/discharge time is larger than that of other components.

A plurality of electronic components constituting the high frequency power circuit 2 is mounted on the second main surface MS2 side of the first rigid portion RP1. The coil 7 for a coil antenna is formed in the second rigid portion RP2. The magnetic material sheet 4 is bonded to the second rigid portion RP2 with an adhesive layer 8 interposed therebetween. The flexible portion FP corresponds to the bending section BS.

In the electronic circuit substrate 1 illustrated in FIG. 4C, no step portion is present in the first main surface MS1, and there is a step portion in the second main surface MS2. The electronic circuit substrate 1 is bent with the second main surface MS2 being set inside. As a result, as illustrated in FIG. 2, the step portion of the electronic circuit substrate is set inside, and a tensile stress is not applied to this step portion, so that peeling of the base material layer due to the tensile stress is unlikely to occur.

Figure 5:
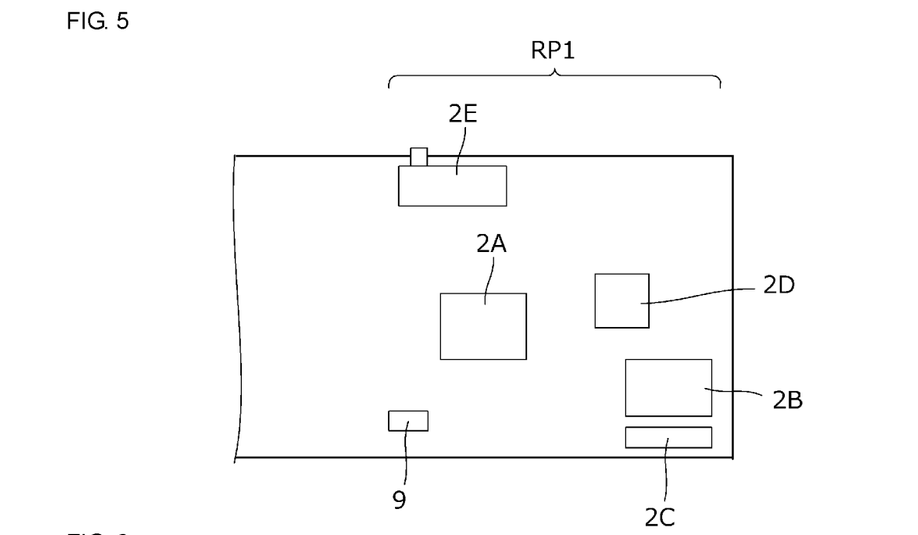
FIG. 5 is a plan view particularly illustrating a first rigid portion of the electronic circuit substrate.

FIG. 5 is a plan view particularly illustrating the first rigid portion RP1. In the first rigid portion RP1, a DC-DC converter 2A, a charge/discharge IC 2B, a short range communication chip antenna 2C, a control IC 2D, a connector 2E, a display electronic component 9, and the like are mounted. The display electronic component 9 is, for example, an LED that indicates a charge/discharge state or an operation state of the battery. The amount of heat generation of the DC-DC converter 2A is relatively large in comparison with other electronic components, because it handles power.

The short range communication chip antenna 2C is a chip antenna configured to perform communication based on, for example, Bluetooth (registered trademark) standards, in particular, Bluetooth (registered trademark) Low Energy (BLE), and is disposed at a position not overlapping with the battery 3 in a plan view. Because of this, electromagnetic waves of the short range communication using this short range communication chip antenna are unlikely to be blocked by the battery. Arrows in FIG. 2 conceptually represent the situation described above. With the above structure, short range communication performance is secured in a wide angle range.

According to the present embodiment, the following effects may be achieved.

(a) Since the high frequency power circuit 2, the battery 3, and the magnetic material sheet 4 are thermally coupled by the resin sealing member 5, the thermal capacity of the high frequency power circuit module 101 is increased, so that the heat dissipation effect is enhanced. Therefore, overheating of the semiconductor elements in the battery 3, the DC-DC converter 2A, and the like is prevented.

(b) Since the magnetic material sheet 4 prevents the magnetic flux coming from the outside or the magnetic flux generated by the coil 7 provided inside the module from linking with the electrodes of the battery 3, the heat generation of the battery 3 due to the above-mentioned magnetic flux linkage is also suppressed.

(c) Since the resin sealing member 5 is transparent, the display state of the display electronic component 9 can be visually recognized from the outside.

The resin sealing member 5 may be a cold-processing resin. In this case, unlike a hot-processing resin, the cold-processing resin is suitable for embedding, in the resin, an electronic component or the like that is vulnerable to heat and pressure. Further, it can also enter into the interior of a porous material sufficiently. It is preferable to use, as the cold-processing resin, a resin having a low contraction coefficient, excellent permeability, low viscosity, and high light transmittance. By using a material having excellent permeability and low viscosity, excellent light transmittance is obtained, thereby making it easy to recognize the display of the display electronic component.

The resin sealing member 5 may be a hot embedding resin. In this case, due to the presence of permeability, the light transmittance is excellent, thereby making it easy to recognize the display of the display electronic component. Further, the curing time is short, and the resin sagging of the edge portion is small. The hot embedding resin is a thermosetting resin, and is suitable for use in a case where an electronic circuit substrate, electronic components, and the like that are excellent in heat resistance and pressure resistance are embedded in the resin.

Second Embodiment

In the second embodiment, an example of a high frequency power circuit module including a heat conductive sheet will be described.

Figure 6:
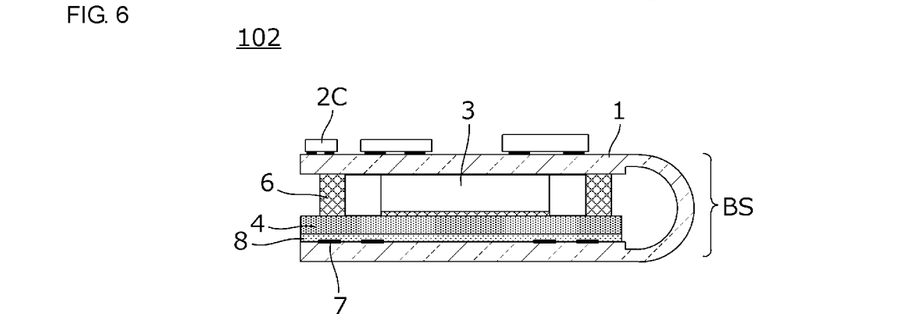
FIG. 6 is a cross-sectional view of a high frequency power circuit module according to a second embodiment.

FIG. 6 is a cross-sectional view of a high frequency power circuit module 102 according to the second embodiment. The high frequency power circuit module 102 includes an electronic circuit substrate 1 having a bending section BS, a high frequency power circuit 2 formed on the electronic circuit substrate 1, a battery 3 connected to the high frequency power circuit 2, a magnetic material sheet 4 having an area larger than that of the battery 3, and a heat conductive sheet 6 disposed between the battery 3 and the magnetic material sheet 4. The heat conductive sheet 6 is disposed not only between the battery 3 and the magnetic material sheet 4, but also between a forming section of the high frequency power circuit 2 and the magnetic material sheet 4. The heat conductive sheet 6 is, for example, a sheet of silicone rubber or a polymer in which a filler with low thermal resistance is dispersed. Other constituent elements are the same as those described in the first embodiment.

According to the present embodiment, since the heat conductive sheet 6 is disposed between the battery 3 and the magnetic material sheet 4, the heat of the battery 3 and the high frequency power circuit 2 is effectively dissipated through the heat conductive sheet 6.

Third Embodiment

In the third embodiment, several structural examples of a resin sealing member will be described.

Figure 7:
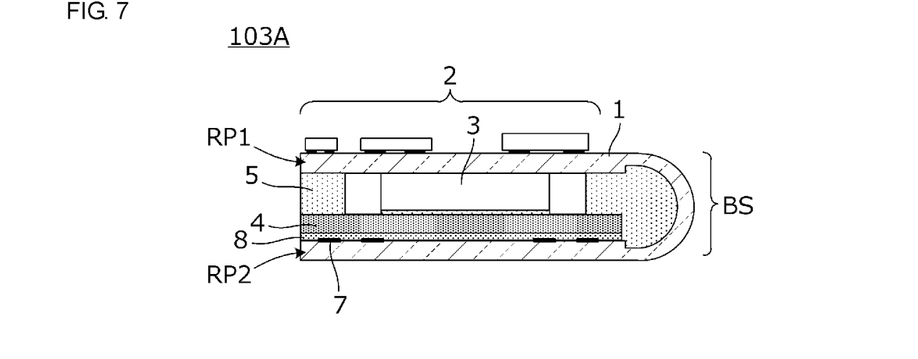
FIG. 7 is a cross-sectional view of a high frequency power circuit module according to a third embodiment.
Figure 8:
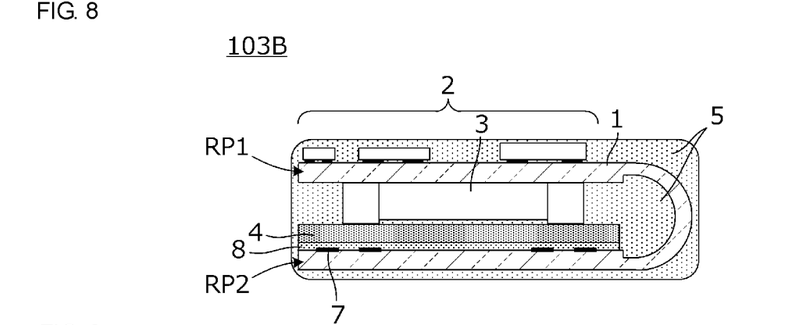
FIG. 8 is a cross-sectional view of a high frequency power circuit module according to the third embodiment.
Figure 9:
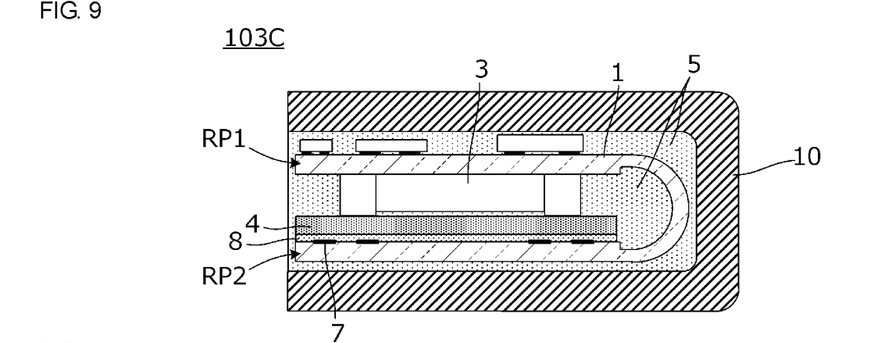
FIG. 9 is a cross-sectional view of a high frequency power circuit module according to the third embodiment.

FIG. 7 is a cross-sectional view of a high frequency power circuit module 103A according to the third embodiment, FIG. 8 is a cross-sectional view of a high frequency power circuit module 103B according to the third embodiment, and FIG. 9 is a cross-sectional view of a high frequency power circuit module 103C according to the third embodiment.

The high frequency power circuit module 103A illustrated in FIG. 7 includes an electronic circuit substrate 1 having a bending section BS, a high frequency power circuit 2 formed on the electronic circuit substrate 1, a battery 3 connected to the high frequency power circuit 2, and a magnetic material sheet 4 having an area larger than that of the battery 3. A resin is provided to fill a space sandwiched between a first rigid portion RP1 and a second rigid portion RP2 of the electronic circuit substrate 1. That is, a resin sealing member 5 is provided in this portion. Other constituent elements are the same as those described in the first embodiment.

The high frequency power circuit module 103B illustrated in FIG. 8 is provided with a resin sealing member 5 that fills a space sandwiched between the first rigid portion RP1 and the second rigid portion RP2 of the electronic circuit substrate 1, and covers a component constituting the high frequency power circuit 2. Other constituent elements are the same as those described in the first embodiment.

The high frequency power circuit module 103C illustrated in FIG. 9 includes a housing. In FIG. 9, a housing 10 is a housing made of an insulating body such as a resin molded body, and the lamination structure illustrated in FIG. 2 is accommodated therein; further, the interior of the housing 10 is filled with a resin. That is, a resin sealing member 5 is provided in the housing 10. Other constituent elements are the same as those described in the first embodiment.

In any of the resin sealing structures described in the present embodiment, the thermal capacity of the high frequency power circuit module is increased, and the heat dissipation effect is enhanced. Therefore, overheating of the battery 3, the DC-DC converter 2A, and the like is prevented. In particular, by providing the housing as illustrated in FIG. 9, not only the thermal capacity is increased but also the structural robustness is enhanced.

Fourth Embodiment

In the fourth embodiment, an example of a high frequency power circuit module will be described in which a position of an adhesive layer is different from the position of the adhesive layer described in each of the aforementioned embodiments. Further, an example of a high frequency power circuit module will be described in which a mounting position of an electronic component constituting a high frequency power circuit is different from that in each of the aforementioned embodiments.

Figure 10:
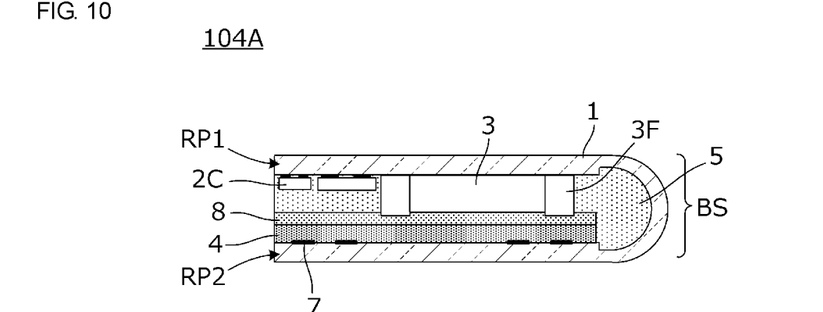
FIG. 10 is a cross-sectional view of a high frequency power circuit module according to a fourth embodiment.
Figure 11:
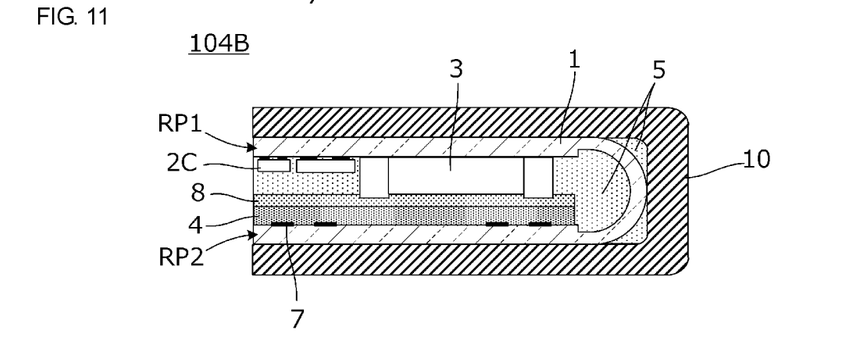
FIG. 11 is a cross-sectional view of a high frequency power circuit module according to the fourth embodiment.

FIG. 10 is a cross-sectional view of a high frequency power circuit module 104A according to the fourth embodiment, and FIG. 11 is a cross-sectional view of a high frequency power circuit module 104B according to the fourth embodiment.

In the high frequency power circuit module 104A illustrated in FIG. 10, a high frequency power circuit is formed in a first rigid section RP1. Further, in the first rigid portion RP1, there are provided a battery folder 3F and a battery 3. A coil 7 is formed in a second rigid portion RP2.

A magnetic material sheet 4 is bonded to the battery folder 3F and the battery 3 with an adhesive layer 8 interposed therebetween. The battery 3 is covered with the magnetic material sheet 4 by the first rigid portion RP1 and second rigid portion RP2 of an electronic circuit substrate 1 being bent at a bending section BS. The magnetic material sheet 4 is interposed between the battery 3 and the coil 7. A resin is provided to fill a space sandwiched between the first rigid portion RP1 and the second rigid portion RP2 of the electronic circuit substrate 1. That is, a resin sealing member 5 is provided in this portion. Other constituent elements are the same as those described in the first embodiment.

The high frequency power circuit module 104B illustrated in FIG. 11 is configured such that the high frequency power circuit module 104A described above is accommodated in a housing 10, and a resin sealing member 5 is provided inside the housing 10. Other constituent elements are the same as those described in the first embodiment.

As discussed in the present embodiment, the magnetic material sheet 4 may be bonded on the battery side. The electronic component constituting the high frequency power circuit may be mounted at the inside of the rigid portion.

Fifth Embodiment

In the fifth embodiment, an example of a high frequency power circuit module having two bending sections will be described.

Figure 12:
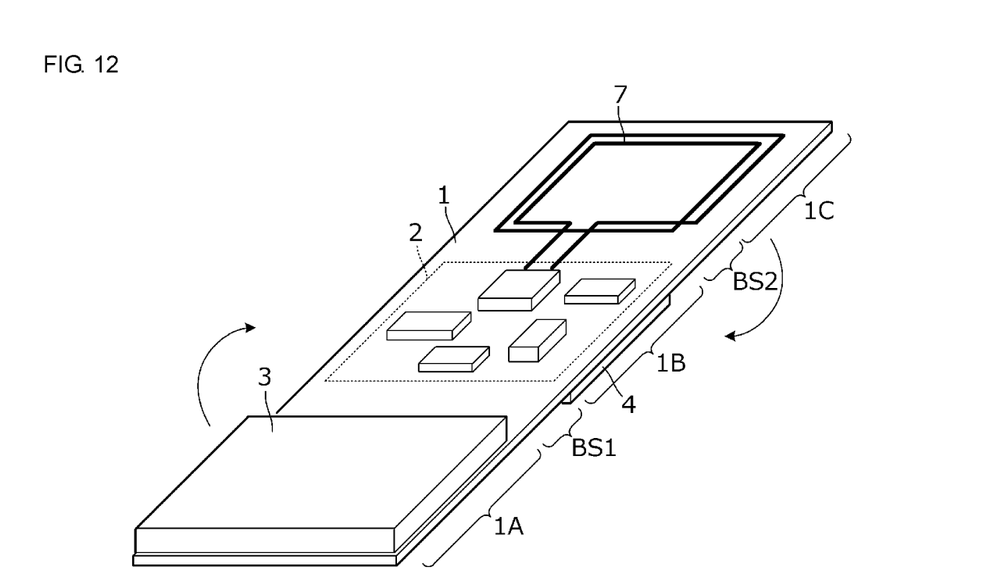
FIG. 12 is a perspective view of an electronic circuit substrate included in a high frequency power circuit module according to a fifth embodiment, in which the electronic circuit substrate is in an unfolded state.
Figure 13:
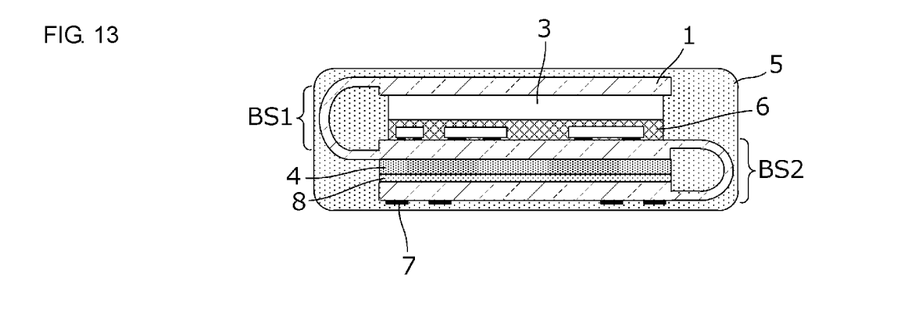
FIG. 13 is a cross-sectional view of the high frequency power circuit module according to the fifth embodiment.

FIG. 12 is a perspective view of an electronic circuit substrate included in a high frequency power circuit module according to the fifth embodiment, in which the electronic circuit substrate is in an unfolded state. FIG. 13 is a cross-sectional view of the high frequency power circuit module.

An electronic circuit substrate 1 includes a first section 1A, a second section 1B, a third section 1C, a first bending section BS1, and a second bending section BS2. In FIG. 12, a battery 3 is provided on the upper surface of the first section 1A. A high frequency power circuit 2 is configured on the upper surface of the second section 1B, and a magnetic material sheet 4 is attached to the lower surface thereof. A coil 7 is formed on the third section 1C.

The first bending section BS1 and the second bending section BS2 are respectively folded back in the directions as illustrated in FIG. 12.

As illustrated in FIG. 13, a heat conductive sheet 6 is disposed between the battery 3 and the second section 1B. Therefore, the heat conductive sheet 6 is disposed between the battery 3 and the magnetic material sheet 4. Further, the magnetic material sheet 4 is disposed between the battery 3 and the coil 7.

The lamination structure illustrated in FIG. 13 is sealed by a resin sealing member 5. Other constituent elements are the same as those described in the first embodiment.

The third section 1C of the electronic circuit substrate 1 where the coil 7 is formed may be a rigid portion, but may be a flexible portion continued from the second bending section BS2 because it is unnecessary to mount an electronic component thereon.

Sixth Embodiment

In the sixth embodiment, a high frequency power circuit module will be described in which an arrangement position of a magnetic material sheet 4 with respect to an electronic circuit substrate is different from the arrangement position of the magnetic material sheet 4 in the example illustrated in FIG. 12. In addition, a high frequency power circuit module including two batteries will be described.

Figure 14:
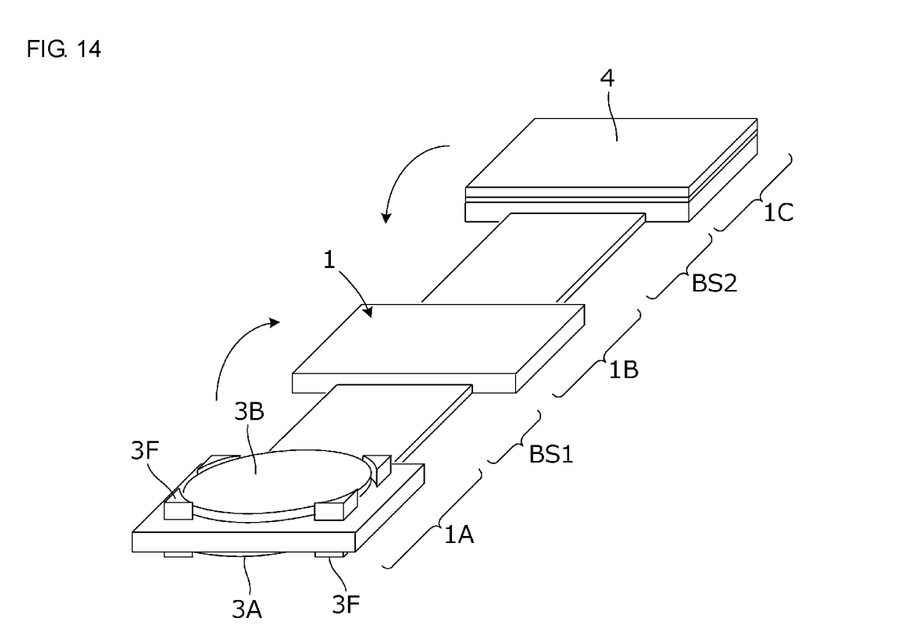
FIG. 14 is a perspective view of an electronic circuit substrate included in a high frequency power circuit module according to a sixth embodiment, in which the electronic circuit substrate is in an unfolded state.
Figure 15:
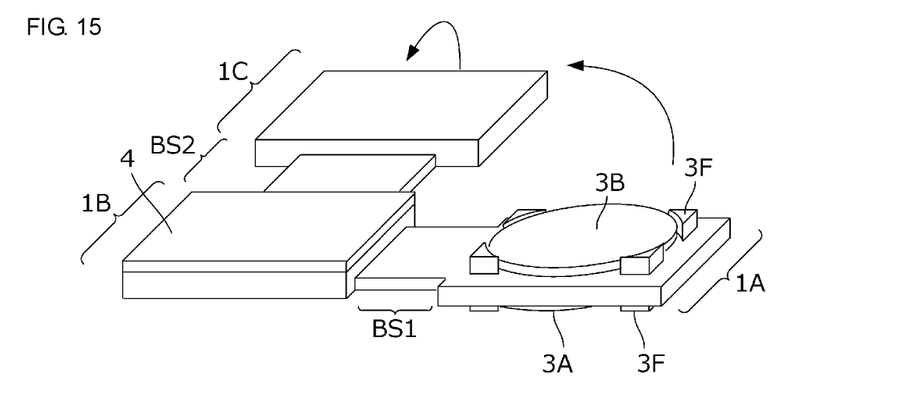
FIG. 15 is a perspective view of an electronic circuit substrate included in the high frequency power circuit module according to the sixth embodiment, in which the electronic circuit substrate is in an unfolded state.

Each of FIG. 14 and FIG. 15 is a perspective view of an electronic circuit substrate included in a high frequency power circuit module according to the sixth embodiment, in which each electronic circuit substrate is in an unfolded state.

In the example illustrated in FIG. 14, in an electronic circuit substrate 1, a third section 1C is folded back onto the upper side of a second section 1B of the substrate, and further a first section 1A is folded back over the third section 1C having been folded back.

In the example illustrated in FIG. 15, an electronic circuit substrate 1 includes a first section 1A, a second section 1B, a third section 1C, a first bending section BS1, and a second bending section BS2. A battery 3B is provided on the upper surface of the first section 1A, and a battery 3A is provided on the lower surface of the first section 1A. A coil is formed on the lower surface of the second section 1B, and a magnetic material sheet 4 is attached onto the upper surface of the second section 1B. A high frequency power circuit is configured on the lower surface of the third section 1C.

In the electronic circuit substrate 1 illustrated in FIG. 15, the first section 1A is folded back onto the upper side of the second section 1B of the substrate, and further the third section 1C is folded back over the first section 1A having been folded back.

Seventh Embodiment

In the seventh embodiment, a high frequency power circuit module having a structure in which a circuit is connected to a battery without using a battery folder, and a high frequency power circuit module in which an electrode of a battery can be extended to the outside will be described.

Figure 16:
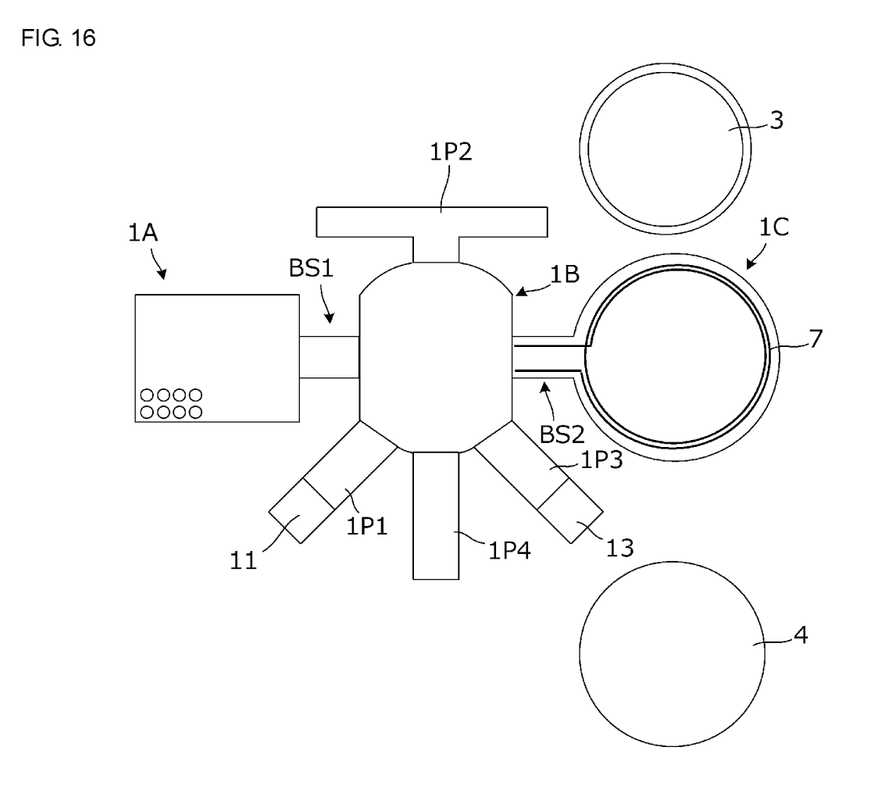
FIG. 16 is a plan view of an electronic circuit substrate included in a high frequency power circuit module according to a seventh embodiment, in which the electronic circuit substrate is in an unfolded state.
Figure 17:
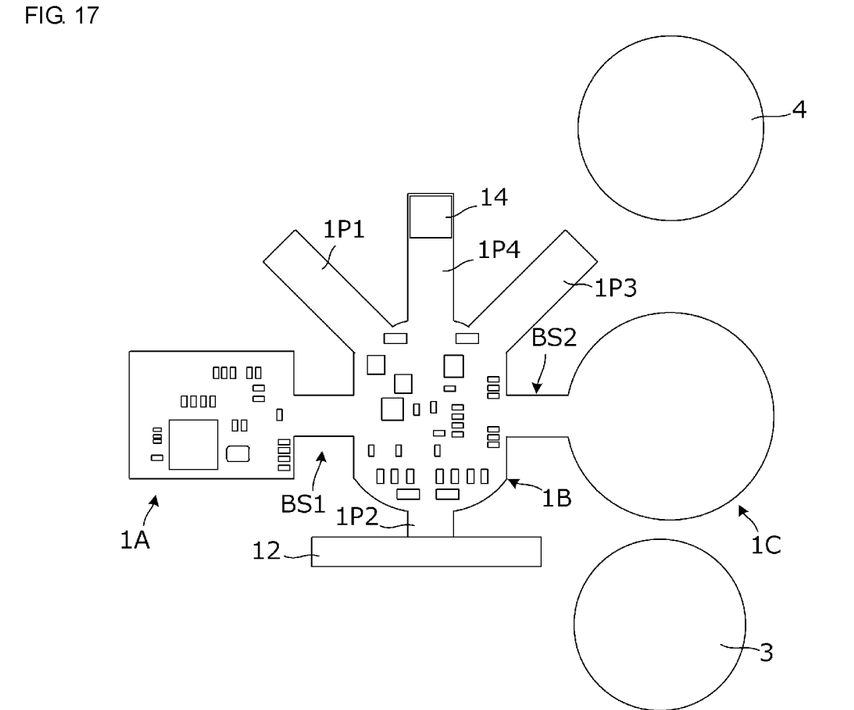
FIG. 17 is a bottom view of the electronic circuit substrate included in the high frequency power circuit module according to the seventh embodiment.
Figure 18:
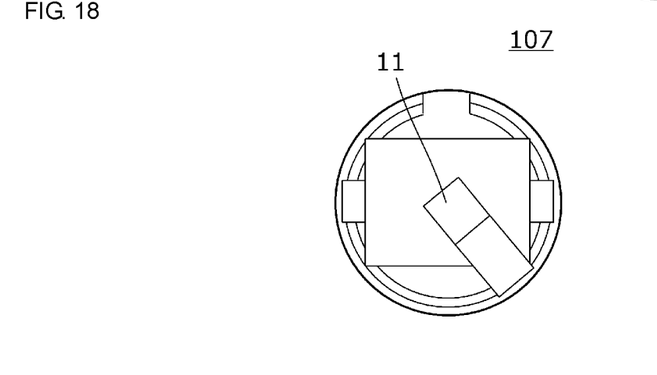
FIG. 18 is a bottom view of a high frequency power circuit module according to the seventh embodiment.

FIG. 16 is a plan view of an electronic circuit substrate included in a high frequency power circuit module according to the seventh embodiment, in which the electronic circuit substrate is in an unfolded state. FIG. 17 is a bottom view thereof. FIG. 18 is a bottom view of a high frequency power circuit module 107 according to the seventh embodiment.

An electronic circuit substrate 1 includes a first section 1A, a second section 1B, a third section 1C, a first bending section BS1, and a second bending section BS2. A high frequency power circuit is configured in the first section 1A and the second section 1B. Projecting sections 1P1, 1P2, 1P3, and 1P4 are formed in the second section 1B, and electrodes 11, 12, 13, and 14 are formed at end portions of the projecting sections 1P1, 1P2, 1P3, and 1P4, respectively. A coil 7 is formed in the third section 1C. A battery 3 is a coin-type secondary battery. The electrodes 11, 14 are connected to the negative electrode of the battery 3 in an electrically conductive manner, and the electrodes 12, 13 are connected to the positive electrode of the battery 3 in an electrically conductive manner. That is, the electrodes 11, 14 are connected to the negative electrode of the battery 3, and the electrodes 12, 13 are connected to the positive electrode of the battery 3.

A conductive adhesive may be used for connection between the battery 3 and each electrode. A one-component conductive adhesive which cures at room temperature can be used as an alternative to solder in the following cases: a case of bonding a component that needs to avoid being subjected to high temperatures, a case where corrosion of a metal pattern caused by solder needs to be prevented, a case where it is difficult to use solder, and the like. A modified silicone-based elastic adhesive of polymer base into which silver is blended, has a sufficiently low resistivity, is excellent in conductivity (volume resistivity: $3.5 \times 10^{-3}$ Ωcm), and can also be used as an alternative to solder.

By using the above-discussed conductive adhesive, it is possible to mount a battery at room temperature without using heat. For example, since it is cured in about 24 hours even at room temperature, the battery can be mounted without heating. When the battery is left to stand while the bottom surface being heated at 80° C., the curing time can be shortened. The polymer-based elastic adhesive mentioned above may also be applied to a bending section of an electronic circuit because it maintains its flexibility after curing and is resistant to repeated bending to some extent. Further, since the stated adhesive has a moderate flexibility, it is resistant to impact.

The high frequency power circuit module 107 is magnetically coupled to a coil of a power transmission device to receive high frequency power, and rectifies and smooths the power to charge an internal secondary battery. The secondary battery is configured such that the voltage thereof can be directly supplied to the outside. Accordingly, the high frequency power circuit module 107 is used as a coin-type battery able to be charged and discharged.

An assembling procedure of the high frequency power circuit module 107 is as follows.

(1) As illustrated in FIG. 16, the second section 1B is taken as the center, and the projecting section 1P4 is folded back by 180 degrees onto the upper surface of the second section 1B, whereby the projecting section 1P4 is brought into contact with the second section 1B. Then, the battery 3 is disposed so that the positive electrode of the battery 3 is brought into contact with the electrode 14.

(2) The projecting section 1P3 is bent by about 180 degrees to be brought into contact with the negative electrode on the upper surface of the battery 3.

(3) The disk-shaped magnetic material sheet 4, which is a size larger than the battery 3, is disposed on the upper surface of the projecting section 1P3 on the upper surface of the battery 3 to cover the battery 3.

(4) The second bending section BS2 is bent by 180 degrees, so that the coil 7 is disposed on the upper surface of the disk-shaped magnetic material sheet 4.

(5) The projecting section 1P2 is bent by 90° toward the upper surface, and an electrode 12 is disposed along a side surface of the battery 3. Thus, the electrode 12 is exposed on the side surface of the high frequency power circuit module 107, and serves as a positive external connection electrode for an apparatus to incorporate the high frequency power circuit module 107.

(6) The first bending section BS1 is bent so that the first section 1A is folded back by 180 degrees on the lower side so as to overlap and make contact with the lower surface of the second section 1B.

(7) The projecting section 1P1 is folded back by 180 degrees to be brought into contact with the lower surface of the first section 1A. Thus, an electrode 11 is exposed on the lower surface of the high frequency power circuit module 107, and serves as a negative external connection electrode for the apparatus to incorporate the high frequency power circuit module 107.

Through the above-discussed assembling procedure, constituted is the high frequency power circuit module 107 to be used as a coin-type battery able to be charged and discharged.

Other Embodiments

In the embodiments described above, the "magnetic material layer" is formed by disposing the magnetic material sheet 4, but the "magnetic material layer" may be formed in such a manner that a liquid magnetic material is applied to a portion where the magnetic material layer is to be provided, and thereafter the liquid magnetic material is cured to form the target magnetic material layer.

Further, in the embodiments discussed above, an example in which the coil is used as a coil for power reception is described, but a single coil may be used for both communication and power reception.

The high frequency power circuit module including a secondary battery is described in the above-discussed embodiments, and the techniques described in the above embodiments may also be applied to a high frequency power circuit module including a primary battery in a similar manner.

Furthermore, although the high frequency power circuit module including a coil formed by a single-layer coil conductor pattern is described in the above-discussed embodiments, a coil in which a coil conductor pattern is formed over a plurality of layers may be provided.

A resist film may be formed on a conductor pattern forming surface such as a coil forming surface, a mounting surface for a chip component, or the like of the electronic circuit substrate. The resist film may be provided by attaching a sheet, or may be formed through a coating process.

Finally, the description of the above embodiments is exemplary in all respects and is not intended to be limiting. It is possible for those skilled in the art to appropriately carry out variations and modifications. The scope of the present disclosure is defined by the appended claims rather than by the embodiments described above. Further, modifications from the embodiments within the scope of the appended claims and within a scope equivalent to the scope of the appended claims are included in the scope of the present disclosure.

What is claimed is:

1. A high frequency power circuit module comprising:
    an electronic circuit substrate including a bending section;
    a high frequency power circuit formed on the electronic circuit substrate;
    a battery electrically connected to the high frequency power circuit; and
    a magnetic material layer having a projected area larger than a projected area of the battery,
    wherein the battery is covered with the magnetic material layer in a state in which the electronic circuit substrate is bent at the bending section,
    the high frequency power circuit module further includes a material to fill a space between the high frequency power circuit and at least one of the battery and the magnetic material layer, and
    the material has a thermal resistance lower than a thermal resistance of air, and thermally couples the high frequency power circuit and at least one of the battery and the magnetic material layer.

2. The high frequency power circuit module according to claim 1, wherein
    the high frequency power circuit includes a display electronic component mounted on the electronic circuit substrate, and
    the material is made of a light-transmitting resin, and display of the display electronic component is visible through the material.

3. The high frequency power circuit module according to claim 1, wherein
    the material is a cold-processing resin.

4. The high frequency power circuit module according to claim 1, wherein the material is a light-transmitting hot embedding resin using an acrylic resin powder.

5. The high frequency power circuit module according to claim 1, wherein
the electronic circuit substrate includes a projecting section, and an electrode to which the battery is connected is formed on the projecting section.

6. The high frequency power circuit module according to claim 1, wherein
a heat conductive sheet is disposed between the battery and the magnetic material layer.

7. The high frequency power circuit module according to claim 1, wherein
a heat conductive sheet is disposed between the magnetic material layer and a heat generating element mounted, as a semiconductor electronic component, on the electronic circuit substrate.

8. The high frequency power circuit module according to claim 1, wherein
a lamination structure including a forming section of the high frequency power circuit of the electronic circuit substrate, the battery, and the magnetic material layer is constituted in a state in which the electronic circuit substrate is bent at the bending section, and
the high frequency power circuit module further includes a housing configured to accommodate the lamination structure.

9. The high frequency power circuit module according to claim 1, wherein
the above-mentioned battery is a secondary battery, and
the high frequency power circuit is a circuit including a power receiving coil and configured to charge the secondary battery with the power received by the power receiving coil.

10. The high frequency power circuit module according to claim 1, wherein
an internal connection electrode to be electrically connected to the battery is formed on the electronic circuit substrate.

11. The high frequency power circuit module according to claim 10, wherein
the battery is connected to the internal connection electrode with a conductive adhesive.

12. The high frequency power circuit module according to claim 11, wherein
the conductive adhesive is a modified silicone-based elastic adhesive of polymer base into which silver is blended.

13. The high frequency power circuit module according to claim 1, wherein
an external connection electrode to be electrically connected to the battery is formed on the electronic circuit substrate.

14. The high frequency power circuit module according to claim 1, wherein
the electronic circuit substrate is a flexible resin multilayer substrate formed by a batch lamination heating press of a plurality of resin base materials including a resin base material on which a copper foil pattern is formed, and
each of a relative dielectric constant, a dielectric loss tangent, and a coefficient of water absorption of the resin base material is small in comparison with a glass epoxy-based substrate resin material.

15. The high frequency power circuit module according to claim 2, wherein
the material is a cold-processing resin.

16. The high frequency power circuit module according to claim 2, wherein
the material is a light-transmitting hot embedding resin using an acrylic resin powder.

17. The high frequency power circuit module according to claim 2, wherein
the electronic circuit substrate includes a projecting section, and an electrode to which the battery is connected is formed on the projecting section.

18. The high frequency power circuit module according to claim 2, wherein
a heat conductive sheet is disposed between the battery and the magnetic material layer.

19. The high frequency power circuit module according to claim 2, wherein
a heat conductive sheet is disposed between the magnetic material layer and a heat generating element mounted, as a semiconductor electronic component, on the electronic circuit substrate.

20. The high frequency power circuit module according to claim 2, wherein
a lamination structure including a forming section of the high frequency power circuit of the electronic circuit substrate, the battery, and the magnetic material layer is constituted in a state in which the electronic circuit substrate is bent at the bending section, and
the high frequency power circuit module further includes a housing configured to accommodate the lamination structure.

* * * * *